United States Patent
Shih et al.

(10) Patent No.: US 10,381,302 B2
(45) Date of Patent: Aug. 13, 2019

(54) SEMICONDUCTOR PACKAGE WITH EMBEDDED MIM CAPACITOR, AND METHOD OF FABRICATING THEREOF

(71) Applicant: Micron Technology, Inc., Boise, ID (US)

(72) Inventors: Shing-Yih Shih, New Taipei (TW); Shih-Fan Kuan, Taoyuan (TW); Tieh-Chiang Wu, Taoyuan (TW)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/396,817

(22) Filed: Jan. 3, 2017

(65) Prior Publication Data
US 2018/0190582 A1   Jul. 5, 2018

(51) Int. Cl.
*H01L 21/48* (2006.01)
*H01L 23/00* (2006.01)
*H01L 49/02* (2006.01)
*H01L 23/498* (2006.01)
(Continued)

(52) U.S. Cl.
CPC ........ *H01L 23/5223* (2013.01); *H01L 21/486* (2013.01); *H01L 21/4853* (2013.01); *H01L 21/4857* (2013.01); *H01L 23/49816* (2013.01); *H01L 23/49827* (2013.01); *H01L 23/49838* (2013.01); *H01L 23/49894* (2013.01); *H01L 24/03* (2013.01); *H01L 24/09* (2013.01); *H01L 24/11* (2013.01); *H01L 24/16* (2013.01); *H01L 25/0655* (2013.01); *H01L 28/60* (2013.01); *H01L 2224/02331* (2013.01);
(Continued)

(58) Field of Classification Search
None
See application file for complete search history.

(56) References Cited

U.S. PATENT DOCUMENTS 9,449,953 B1    9/2016 Shih et al.
2006/0024899 A1*  2/2006 Crenshaw ........... H01L 23/5223
                                                          438/381

(Continued)

OTHER PUBLICATIONS

Taiwanese Office Action and Search Report from Taiwanese Application No. 106107079, dated Mar. 28, 2018, 20 pages with English translation.

(Continued)

*Primary Examiner* — Erik Kielin
(74) *Attorney, Agent, or Firm* — TraskBritt

(57) ABSTRACT

An interposer includes a first redistribution layer, an organic substrate, a capacitor, a hard mask layer, a conductive pillar, and a second redistribution layer. The organic substrate is on the first redistribution layer. The capacitor is embedded in the organic substrate and includes a first electrode layer, a second electrode layer, and a capacitor dielectric layer between the first electrode layer and the second electrode layer. The first electrode layer electrically connects with the first redistribution layer. The hard mask layer is on the organic substrate. The conductive pillar is embedded in the organic substrate and the hard mask layer and electrically connects with the first redistribution layer. The second redistribution layer is on the hard mask layer and electrically connects with the second electrode layer and the conductive pillar.

14 Claims, 11 Drawing Sheets

(51) Int. Cl.
*H01L 23/522* (2006.01)
*H01L 25/065* (2006.01)

(52) U.S. Cl.
CPC ............... *H01L 2224/0401* (2013.01); *H01L 2924/1205* (2013.01); *H01L 2924/18161* (2013.01)

(56) References Cited

U.S. PATENT DOCUMENTS

| | | | | |
|---|---|---|---|---|
| 2007/0121273 | A1* | 5/2007 | Yamamoto | H01G 4/232 361/306.2 |
| 2010/0230806 | A1* | 9/2010 | Huang | H01L 23/50 257/723 |
| 2013/0328167 | A1* | 12/2013 | Yang | H01L 23/5223 257/532 |
| 2014/0217549 | A1* | 8/2014 | Tzeng | H01L 23/147 257/532 |
| 2014/0367828 | A1 | 12/2014 | Colonna et al. | |
| 2015/0250058 | A1* | 9/2015 | Ramachandran | H01L 21/28008 361/748 |
| 2015/0264813 | A1 | 9/2015 | Zhou et al. | |
| 2016/0111398 | A1 | 4/2016 | Hsiao et al. | |

OTHER PUBLICATIONS

Taiwanese Office Action from Taiwanese Application No. 106107079, dated Nov. 16, 2018, 19 pages.

\* cited by examiner

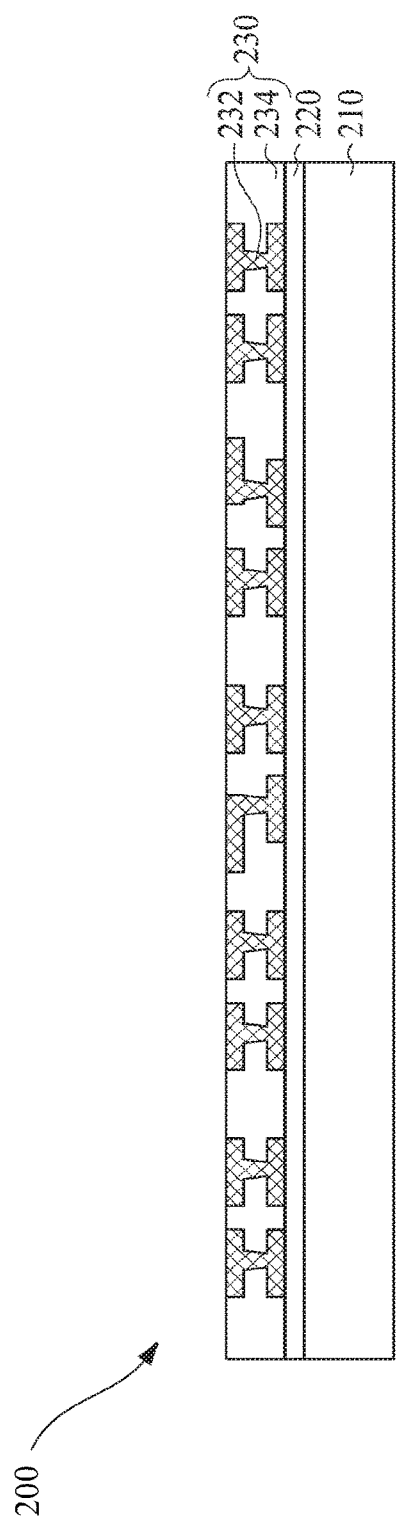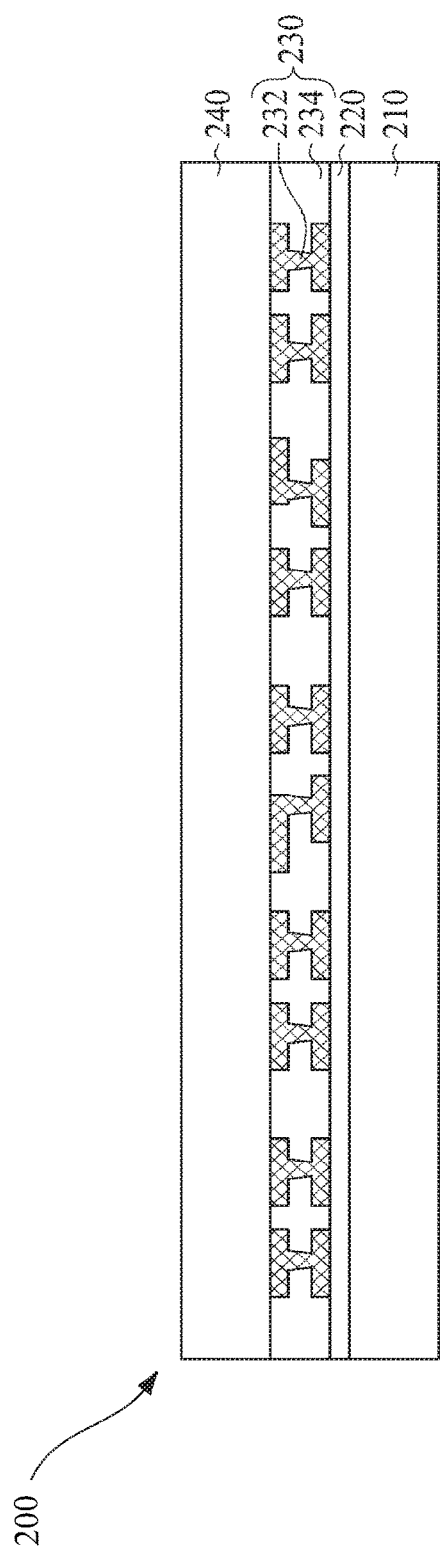

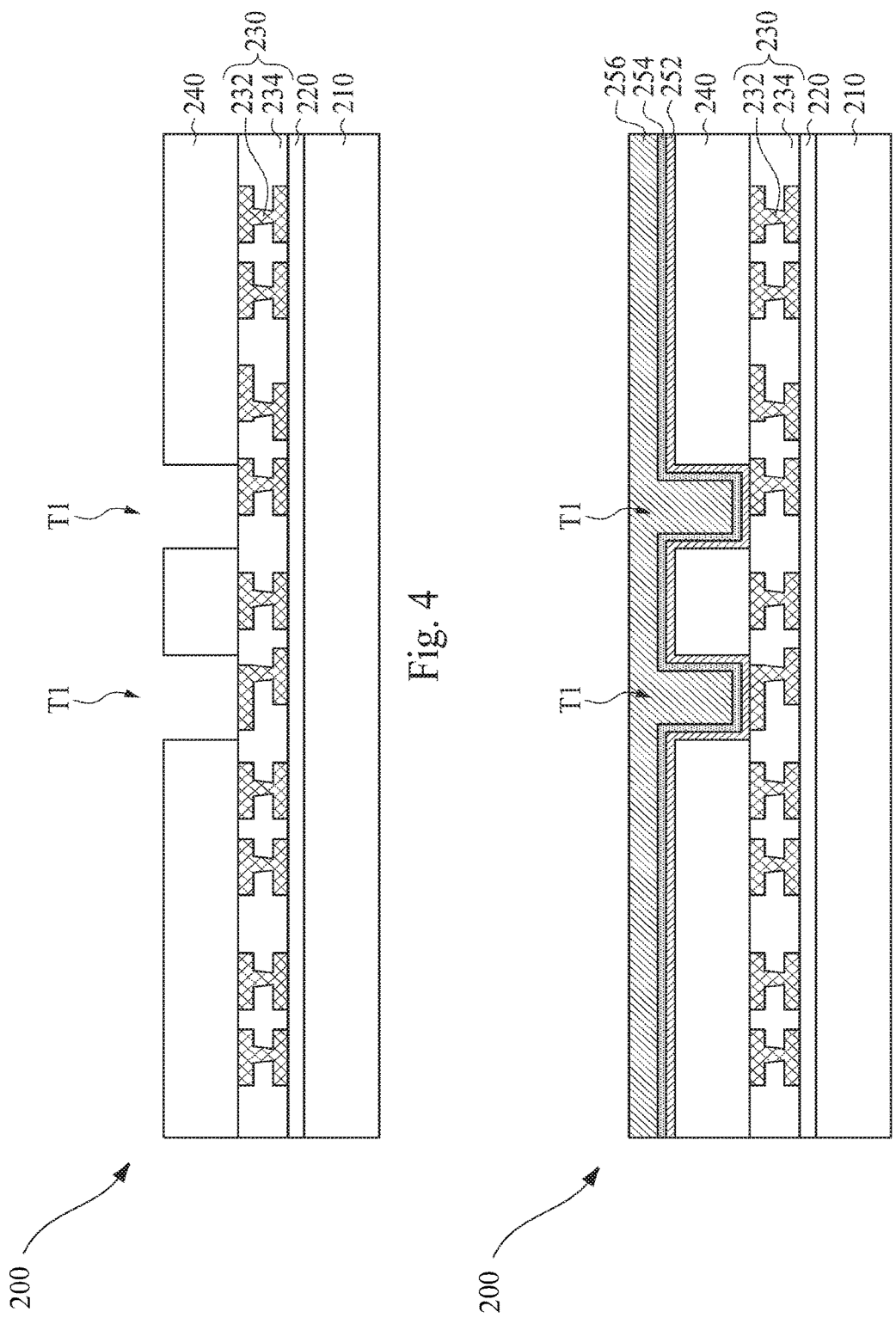

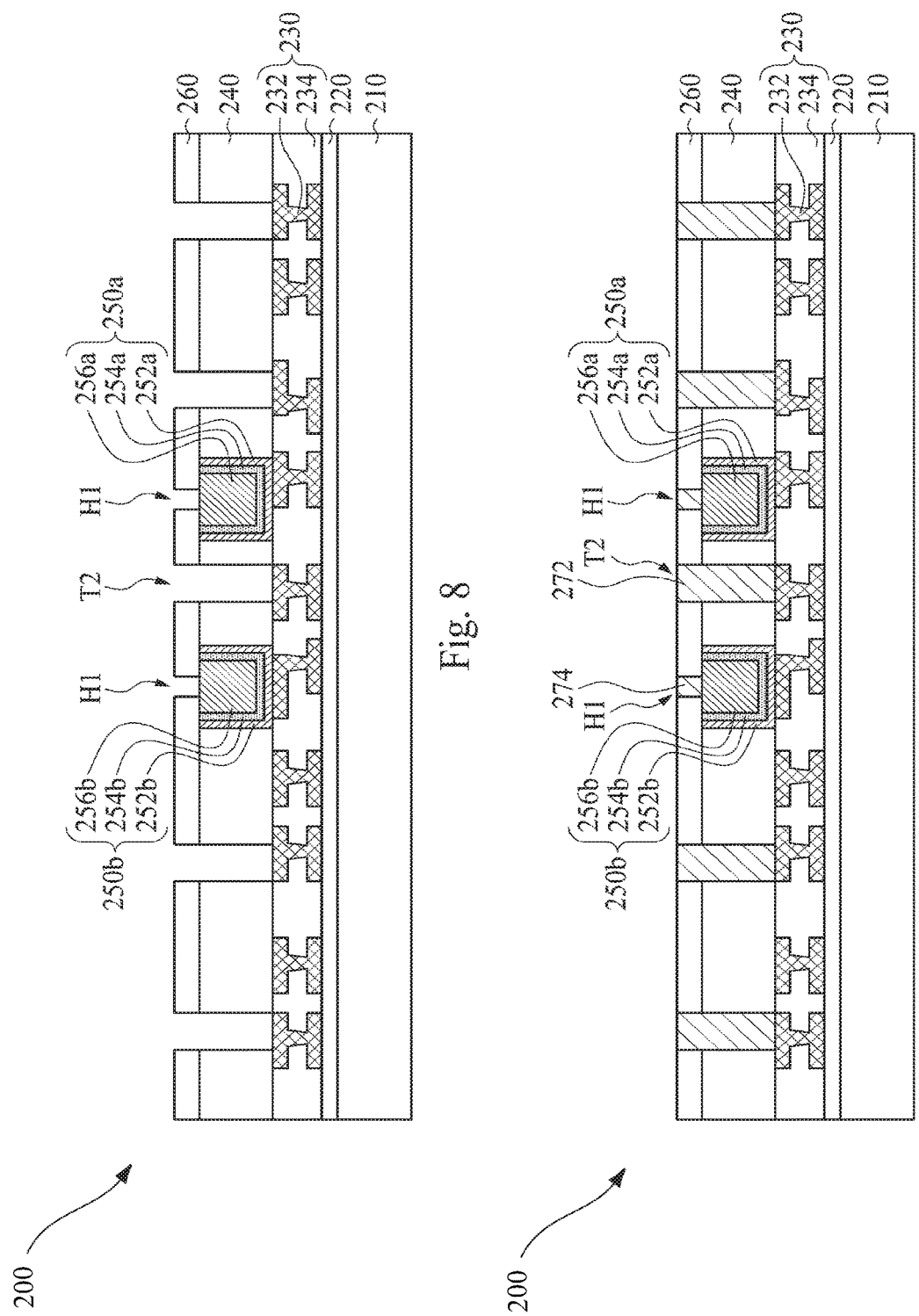

SEMICONDUCTOR PACKAGE WITH EMBEDDED MIM CAPACITOR, AND METHOD OF FABRICATING THEREOF

TECHNICAL FIELD

Field of Invention

This disclosure relates to a semiconductor package with an embedded metal-insulator-metal (MIM) capacitor and a method of fabricating thereof. More particularly, this disclosure relates to an interposer with an embedded MIM capacitor, a semiconductor package including the interposer, and a method of fabricating the semiconductor package.

BACKGROUND

Description of Related Art

The semiconductor integrated circuit (IC) industry has experienced rapid growth. During the growth, size or geometry of the semiconductor devices has greatly decreased. The industry has recently been developing technology to enable vertical integration of semiconductor devices, known generally as 2.5-dimensional (2.5D) packaging technology.

In the 2.5D packaging technology, active components and passive components, such as capacitors, are usually formed on a silicon interposer for forming a semiconductor package. However, these active components and passive components usually require a large amount of installation space, and therefore it difficult to further minimize size of the semiconductor package. Accordingly, an improved interposer, an improved semiconductor package, and a method of fabricating the semiconductor package are required.

BRIEF SUMMARY

The present disclosure provides an interposer. The interposer includes a first redistribution layer, an organic substrate, a capacitor, a hard mask layer, a first conductive pillar, and a second redistribution layer. The organic substrate is on the first redistribution layer. The capacitor is embedded in the organic substrate and includes a first electrode layer, a second electrode layer, and a capacitor dielectric layer between the first electrode layer and the second electrode layer. The first electrode layer electrically connects with the first redistribution layer. The hard mask layer is on the organic substrate. The first conductive pillar is embedded in the organic substrate and the hard mask layer and electrically connects with the first redistribution layer. The second redistribution layer is on the hard mask layer and electrically connects with the second electrode layer and the first conductive pillar.

In one embodiment, the first electrode layer surrounds the second electrode layer and is coaxial with the second electrode layer.

In one embodiment, the capacitor penetrates through the organic substrate.

In one embodiment, the first conductive pillar penetrates through the hard mask layer and the organic substrate.

In one embodiment, the first conductive pillar electrically connects with the second electrode layer by the second redistribution layer.

In one embodiment, the first electrode layer has a surface coplanar with the first redistribution layer.

In one embodiment, the first electrode layer has a surface coplanar with the hard mask layer.

In one embodiment, the first conductive pillar has a surface coplanar with the second redistribution layer.

In one embodiment, the interposer further includes a microbump electrically connecting with the first redistribution layer.

In one embodiment, the interposer further includes a second conductive pillar embedded in the hard mask layer and between the second electrode layer and the second redistribution layer.

The present disclosure provides a semiconductor package. The semiconductor package includes the interposer described in any one of the aforementioned embodiments, a microbump, and a chip. The microbump electrically connects with the first redistribution layer. The chip is connected with the microbump.

The present disclosure provides a method of fabricating a semiconductor package. An organic substrate is formed on a first redistribution layer. A capacitor is embedded in the organic substrate and includes a first electrode layer, a second electrode layer, and a capacitor dielectric layer between the first electrode layer and the second electrode layer. The first electrode layer electrically connects with the first redistribution layer. A hard mask layer is formed on the organic substrate. A first conductive pillar is embedded in the hard mask layer and the organic substrate to electrically connect with the first redistribution layer. A second redistribution layer is formed on the hard mask layer to electrically connect with the first conductive pillar and the second electrode layer. A microbump is formed to electrically connect with the first redistribution layer. A chip is connected with the microbump.

In one embodiment, the step of embedding the capacitor in the organic substrate includes the following steps. A trench is formed in the organic substrate to expose the first redistribution layer. A first electrode layer is formed in the trench. A capacitor dielectric layer is formed on the first electrode layer. A second electrode layer is formed on the capacitor dielectric layer.

In one embodiment, the step of embedding the first conductive pillar in the hard mask layer and the organic substrate includes the following steps. The organic substrate is etched through the hard mask layer with a hole to form a trench to expose the first redistribution layer. The first conductive pillar is formed in the trench.

In one embodiment, the method further includes embedding a second conductive pillar in the hard mask layer and between the second electrode layer and the second redistribution layer.

In one embodiment, before forming the organic substrate on the first redistribution layer, the method further includes forming the first redistribution layer on a passivation layer, wherein the microbump is embedded in the passivation layer in contact with the first redistribution layer.

In one embodiment, the second electrode layer of the capacitor electrically connects with the first conductive pillar by the second redistribution layer.

It is to be understood that both the foregoing general description and the following detailed description are by examples, and are intended to provide further explanation of the invention as claimed.

BRIEF DESCRIPTION OF THE DRAWINGS

The disclosure can be more fully understood by reading the following detailed description of the embodiment, with reference made to the accompanying drawings as follows:

FIGS. 2-15 are cross-sectional views of the semiconductor package at various stages of fabrication, in accordance with various embodiments.

DETAILED DESCRIPTION

Figure 1:
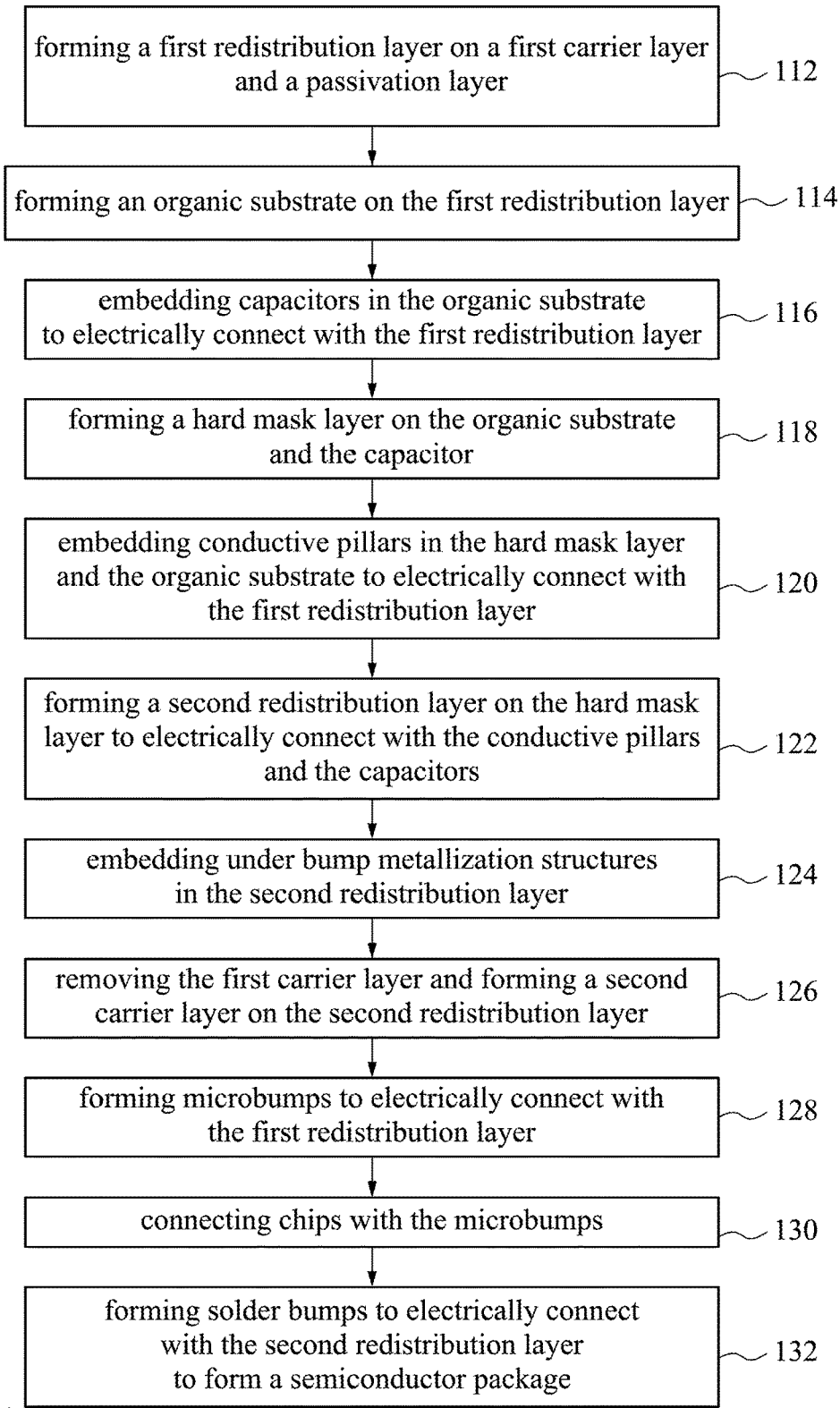
FIG. 1 is a flowchart of a method of fabricating a semiconductor package, in accordance with various embodiments.

Reference will now be made in detail to the present embodiments of the disclosure, examples of which are illustrated in the accompanying drawings. Wherever possible, the same reference numbers are used in the drawings and the description to refer to the same or like parts.

The following embodiments are disclosed with accompanying diagrams for detailed description. For illustration clarity, many details of practice are explained in the following descriptions. However, it should be understood that these details of practice do not intend to limit the present disclosure. That is, these details of practice are not necessary in parts of embodiments of the present disclosure. Furthermore, for simplifying the drawings, some of the conventional structures and elements are shown with schematic illustrations.

It will be understood that when an element is referred to as being "connected" or "coupled" to another element, it can be directly connected or coupled to the other element or intervening elements may be present In contrast, when an element is referred to as being "directly connected" or "directly coupled" to another element, there are no intervening elements present.

Please refer to FIG. 1 and FIGS. 2-15 at the same time. FIG. 1 is a flowchart of a method 100 of fabricating a semiconductor package 200 shown in FIG. 15, in accordance with various embodiments. The method 100 includes operations 112-132. FIGS. 2-15 are cross-sectional views of the semiconductor package 200 at various stages of fabrication, in accordance with various embodiments. Although below using a series of operations described in this method disclosed, but the order of these operations shown should not be construed to limit the present disclosure. For example, certain operations may be performed in different orders and/or concurrently with other operations. Moreover, not all operations must be performed in order to achieve the depicted embodiment of the present disclosure. Furthermore, each operation described herein may contain several sub-steps.

In operation 112, a first redistribution layer 230 is formed on a first carrier layer 210 and a passivation layer 220 as shown in FIG. 2. The passivation layer 220 is disposed on the first carrier layer 210. The first redistribution layer 230 includes a first interconnect structure 232 and a first dielectric layer 234. The first interconnect structure 232 is embedded in the first dielectric layer 234. The first interconnect structure 232 may include multiple metal layers, and the first dielectric layer 234 may include multiple dielectric layers.

In one embodiment, the first carrier layer 210 is a glass substrate, a metal substrate, a Si substrate, or a ceramic substrate. Further, the passivation layer 220 may include inorganic material or organic material. For instance, the material of the passivation layer 220 includes, but is not limited to, silicon dioxide ($SiO_2$), silicon nitride ($Si_3N_4$), silicon oxynitride (SiON), silicon carbide (SiC), polyimide (PI), polybenzoxazole (PBO), or a combination thereof.

In operation 114, an organic substrate 240 is formed on the first redistribution layer 230 as shown in FIG. 3. For instance, a material of the organic substrate 240 includes, but is not limited to, polyimide (PI), benzocyclobutene (BCB), polybenzoxazole (PBO), epoxy resin, or a combination thereof.

Figure 6:
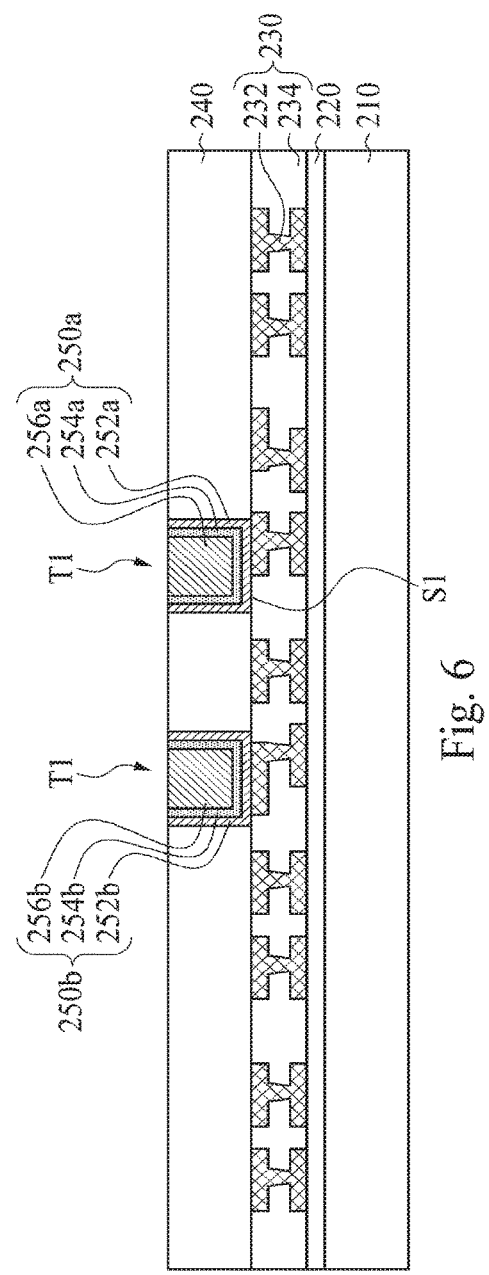

In operation 116, a capacitor 250a and a capacitor 250b are embedded in the organic substrate 240 to electrically connect with the first redistribution layer 230 as shown in FIG. 6. Both the capacitor 250a and the capacitor 250b have metal-insulator-metal (MIM) structure and can be formed by the following steps. Please refer to FIGS. 4-6. As shown in FIG. 4, trenches T1 are formed in the organic substrate 240 to expose the first redistribution layer 230. More specifically, a portion of the first interconnect structure 232 is exposed through the trenches T1. Subsequently, as shown in FIG. 5, a first electrode layer 252 is formed in the trenches T1 and on the organic substrate 240, a capacitor dielectric layer 254 is formed on the first electrode layer 252, and a second electrode layer 256 is formed on the capacitor dielectric layer 254. For instance, the first electrode layer 252, and the second electrode layer 256 may formed by electroplating, electroless plating, sputtering, and the capacitor dielectric layer 254 may formed by ALD or PECVD. In one embodiment, the first electrode layer 252 includes a barrier layer and a conductive layer. The first electrode layer 252 and the second electrode layer 256 may be made of any suitable conductive material, such as copper, chromium, nickel, aluminum, gold, silver, tungsten, titanium, tantalum, tin, platinum, palladium, titanium nitride (TiN), titanium tungsten (TiW), tantalum nitride (TaN), nickel vanadium (NiV), or chromium copper (CrCu). Next, as shown in FIG. 6, the first electrode layer 252, the capacitor dielectric layer 254, and the second electrode layer 256 are planarized to form the capacitor 250a and the capacitor 250b in the trenches T1. In one embodiment, after planarization, the upper surface of the capacitor 250a is coplanar with the organic substrate 240. However, in another embodiment, after planarization, the upper surface of the capacitor 250a is a concave upper surface. For instance, the planarization process may be a chemical mechanical polishing (CMP) process.

As shown in FIG. 6, the capacitor 250a penetrates through the organic substrate 240 and includes a first electrode layer 252a, a capacitor dielectric layer 254a, and a second electrode layer 256a. The capacitor dielectric layer 254a is between the first electrode layer 252a and the second electrode layer 256a, such that the first electrode layer 252a is isolated from the second electrode layer 256a with the capacitor dielectric layer 254a. More specifically, the first electrode layer 252a surrounds the capacitor dielectric layer 254a and is coaxial with the capacitor dielectric layer 254a, and the capacitor dielectric layer 254a surrounds the second electrode layer 256a and is coaxial with the second electrode layer 256a. Accordingly, the first electrode layer 252a surrounds the second electrode layer 256a and is coaxial with the second electrode layer 256a. Further, the first electrode layer 252a has a surface S1 coplanar with the first redistribution layer 230. Therefore, the first electrode layer 252a is disposed in contact with the first interconnect structure 232 of the first redistribution layer 230 and electrically connects with the first redistribution layer 230. The capacitor 250b includes a first electrode layer 252b, a capacitor dielectric layer 254b, and a second electrode layer 256b. Because the structure of capacitor 250b is same as the capacitor 250a, there is no need to give unnecessary details.

Figure 7:
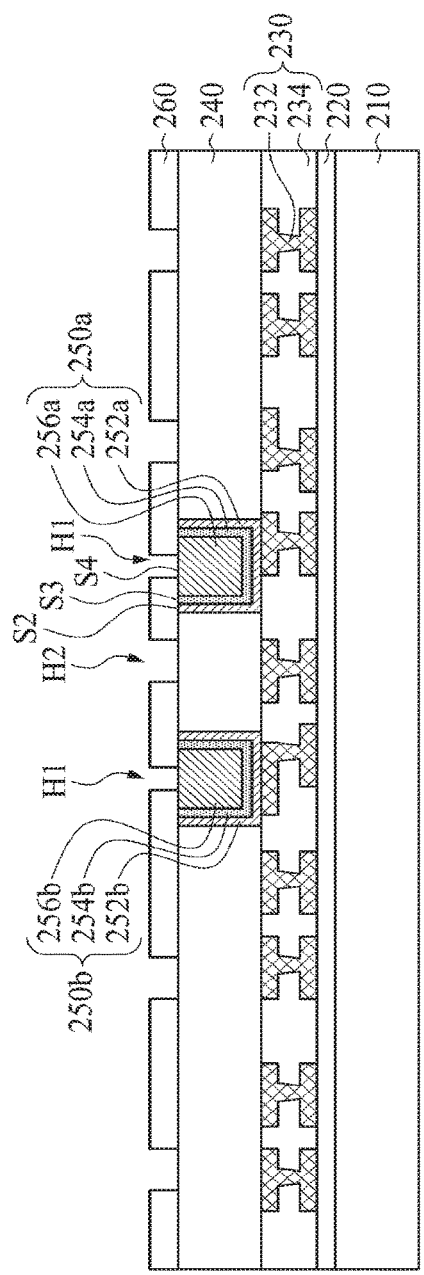

In operation 118, a hard mask layer 260 is formed on the organic substrate 240 and the capacitor 250a as shown in FIG. 7. The hard mask layer 260 has holes H1 and holes H2. For instance, the holes H1 and the holes H2 may be formed by etching a hard mask layer through a patterned photoresist layer, which may be formed by exposure and development processes. The capacitor 250a and the capacitor 250b are exposed through the holes H1, and portions of the organic substrate 240 are exposed through the holes H2. The hard mask layer 260 may be formed by any suitable materials with low coefficient of thermal expansion (CTE). For example, a material of the hard mask layer 260 includes silicon dioxide ($SiO_2$), silicon nitride ($Si_3N_4$), silicon oxynitride (SiON), or a combination thereof.

As mentioned previously, in one embodiment, the upper surface of the capacitor 250a is coplanar with the organic substrate 240. Therefore, in this embodiment, the upper surface of the capacitor 250a is also coplanar with the hard mask layer 260. More specifically, the first electrode layer 252a has a surface S2 coplanar with the hard mask layer 260, the capacitor dielectric layer 254a has a surface S3 coplanar with the hard mask layer 260, and the second electrode layer 256a has a surface S4 coplanar with the hard mask layer 260.

In operation 120, first conductive pillars 272 are embedded in the hard mask layer 260 and the organic substrate 240 to electrically connect with the first redistribution layer 230 as shown in FIG. 9. The first conductive pillars 272 can be formed by the following steps. Please refer to FIGS. 8 and 9. As shown in FIG. 8, the organic substrate 240 is etched through the holes H2 of the hard mask layer 260 to form trenches T2 to expose the first redistribution layer 230. More specifically, portions of the first interconnect structure 232 are exposed through the trenches T2. As shown in FIG. 9, the first conductive pillars 272 are formed in the trenches T2. Concurrently, second conductive pillars 274 are formed in the holes H1.

As shown in FIG. 9, the first conductive pillars 272 penetrate through the hard mask layer 260 and the organic substrate 240 and are disposed in contact with the first interconnect structure 232 of the first redistribution layer 230; therefore, the first conductive pillars 272 can electrically connect with the first redistribution layer 230. Further, the second conductive pillars 274 penetrate through the hard mask layer 260 and are disposed in contact with the second electrode layer 256b; therefore, the second conductive pillars 274 can electrically connect with the second electrode layer 256a and the second electrode layer 256b.

Figure 10:
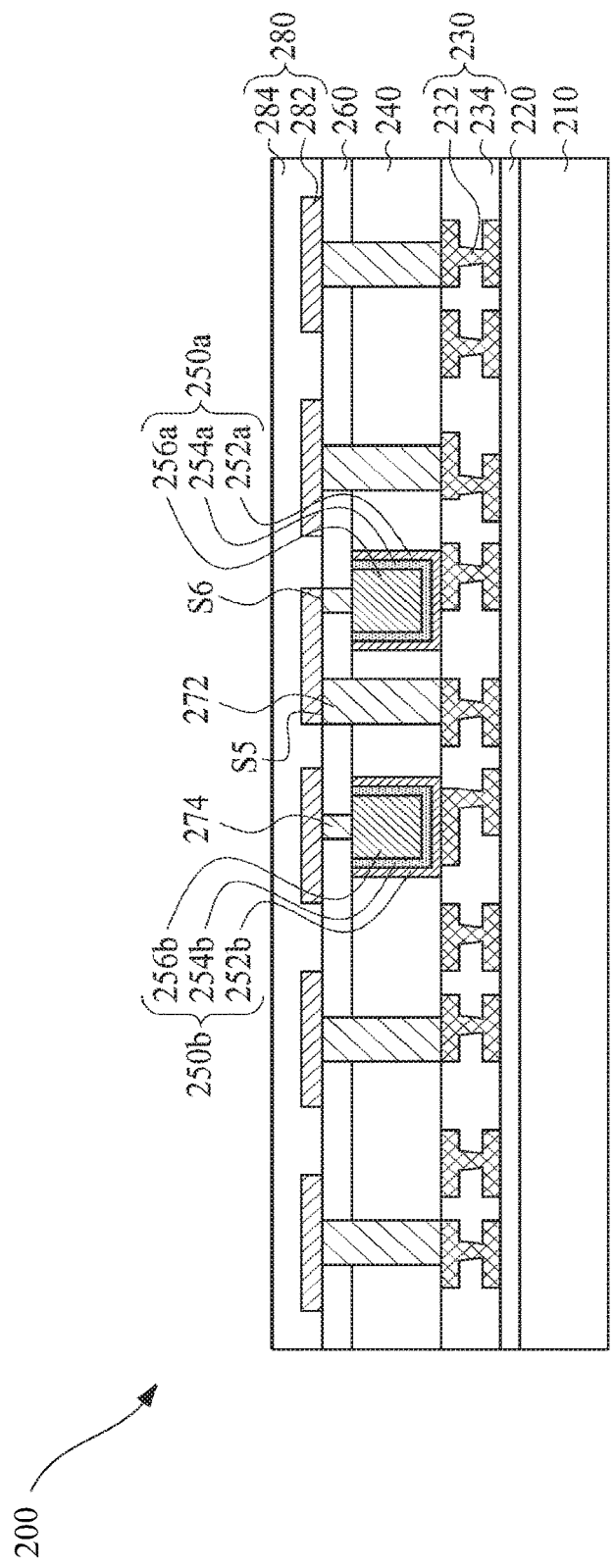

In operation 122, a second redistribution layer 280 is formed on the hard mask layer 260 to electrically connect with the first conductive pillars 272, the capacitor 250a, and the capacitor 250b as shown in FIG. 10. The second redistribution layer 280 includes a second interconnect structure 282 and a second dielectric layer 284. The second interconnect structure 282 is embedded in the second dielectric layer 284. Therefore, more specifically, the first conductive pillars 272 are disposed between the first interconnect structure 232 and the second interconnect structure 282, and the second conductive pillars 274 are disposed between the second electrode layer 256a and the second interconnect structure 282. Further, the second interconnect structure 282 may include multiple metal layers, and the second dielectric layer 284 may include multiple dielectric layers.

As shown in FIG. 10, the second interconnect structure 282 is disposed in contact with the first conductive pillars 272 and the second conductive pillars 274, such that the second interconnect structure 282 electrically connects with the first conductive pillars 272 and the second electrode layer 256a. In one embodiment, each first conductive pillar 272 has a surface S5 coplanar with the second redistribution layer 280, and each second conductive pillar 274 also has a surface S6 coplanar with the second redistribution layer 280. Further, the second electrode layer 256a electrically connects with one of the first conductive pillars 272 by the second redistribution layer 280. However, the second electrode layer 256b does not connect with any first conductive pillars 272 by the second redistribution layer 280. In one embodiment, the second electrode layer 256b is electrically insulated from the first conductive pillars 272.

Figure 11:
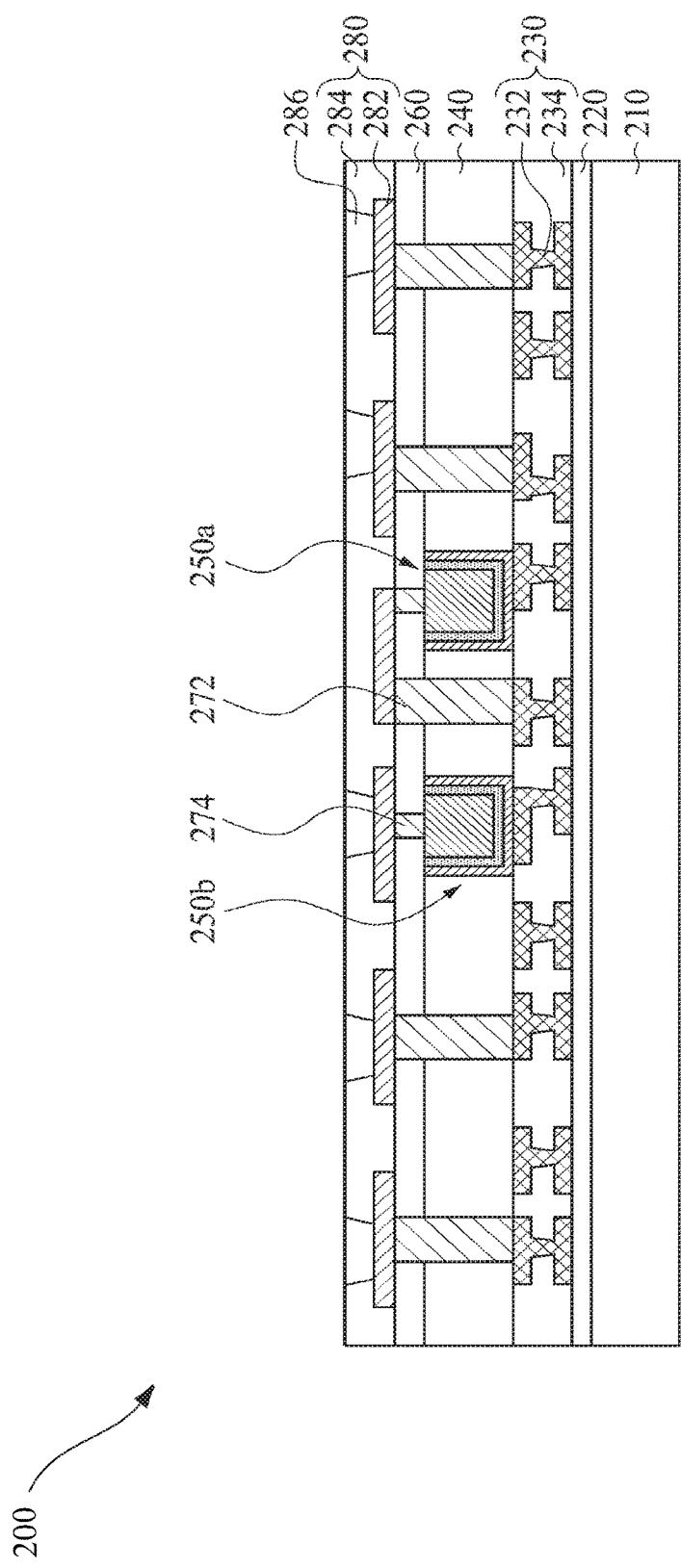

In operation 124, under bump metallization (UBM) structures 286 are embedded in the second redistribution layer 280 as shown in FIG. 11. The UBM structures 286 are disposed in contact with the second interconnect structure 282 and therefore electrically connect with the second interconnect structure 282. Further, the upper surfaces of the UBM structures 286 are exposed for connecting solder bumps in subsequent operations. In one embodiment, the UBM structures 286 include an adhesion layer, a barrier layer, a seed layer, a wetting layer, or a combination thereof. A material of the UBM structures 286 includes but is not limited to, copper, chromium, nickel, aluminum, gold, silver, tungsten, titanium, tantalum, tin, platinum, palladium, titanium nitride (TiN), titanium tungsten (TiW), tantalum nitride (TaN), nickel vanadium (NiV), or chromium copper (CrCu).

Figure 12:
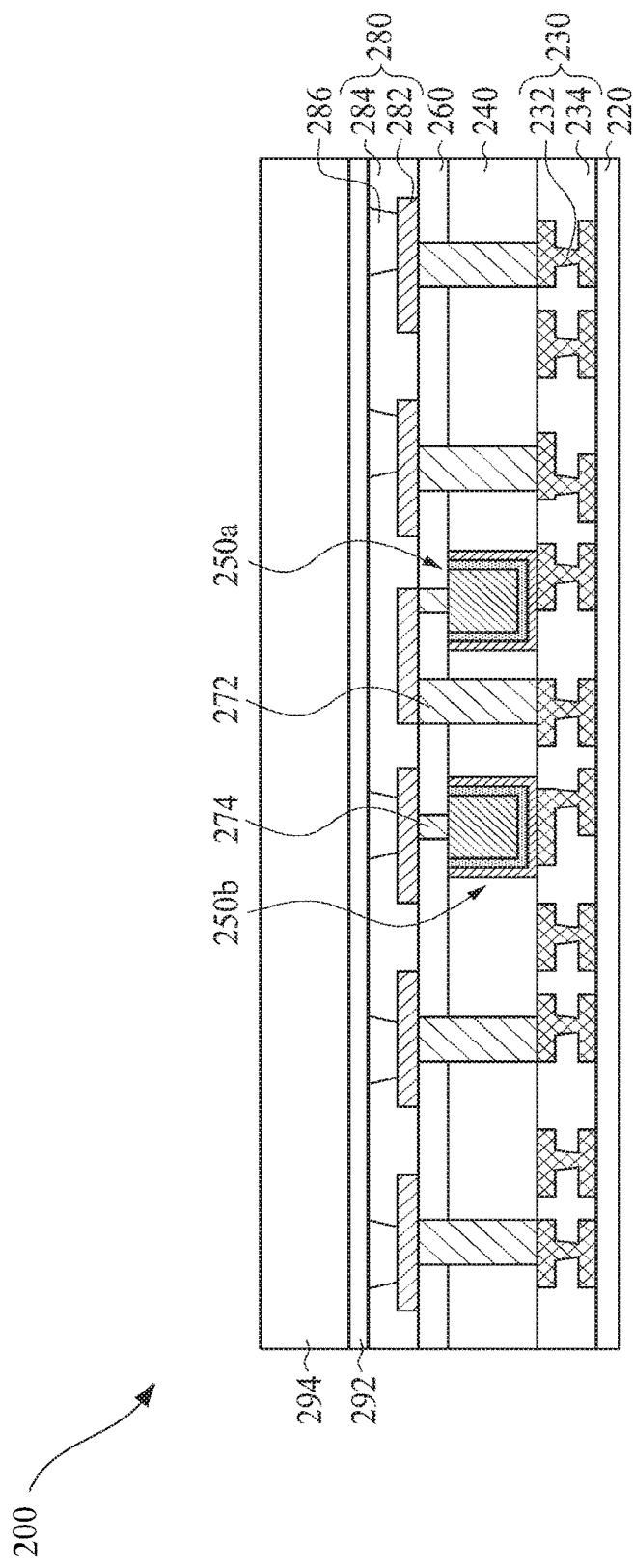

In operation 126, the first carrier layer 210 is removed to expose the passivation layer 220, and a second carrier layer 294 is formed on the second redistribution layer 280 as shown in FIG. 12. More specifically, the second carrier layer 294 is adhered on the second redistribution layer 280 by an adhesion layer 292. In one embodiment, the first carrier layer 210 may be removed by grinding, etching, or both. In one embodiment, the second carrier layer 294 is a glass substrate, metal substrate, Si substrate, or ceramic substrate.

Figure 13:
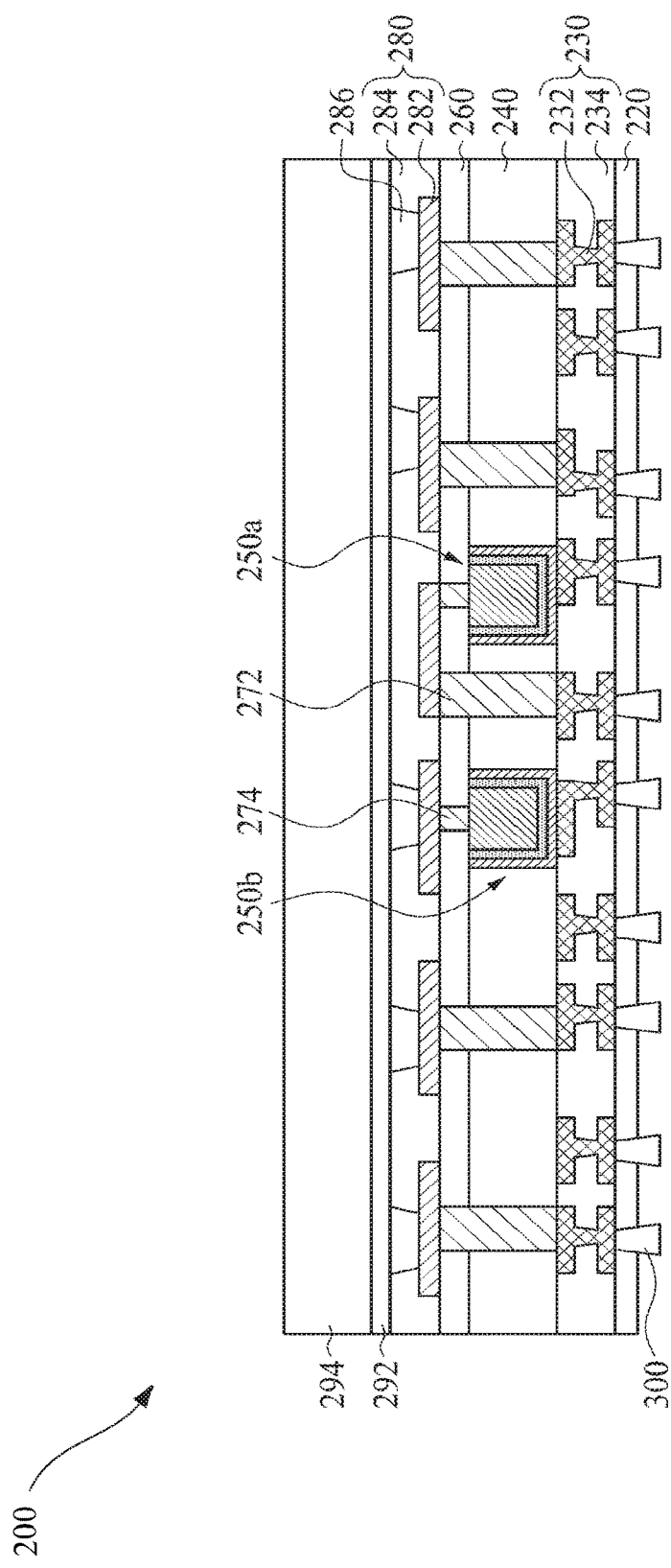

In operation 128, microbumps 300 are formed to electrically connect with the first redistribution layer 230 as shown in FIG. 13. More specifically, the microbumps 300 are embedded in the passivation layer 220 in contact with the first interconnect structure 232 of the first redistribution layer 230.

Figure 14:
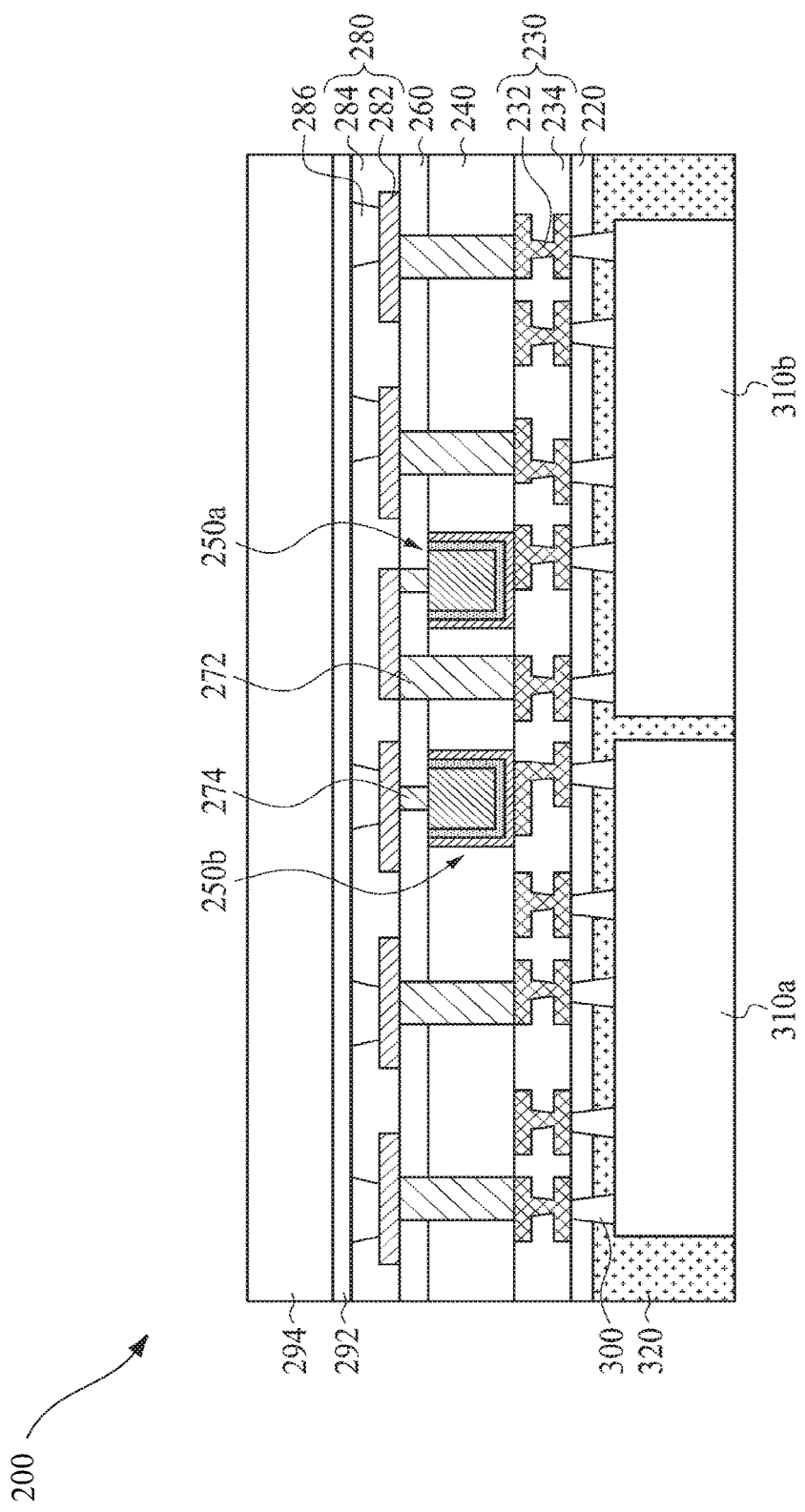

In operation 130, a chip 310a and a chip 310b are connected with the microbumps 300 as shown in FIG. 14. Moreover, a molding compound 320 surrounds the chip 310a and the chip 310b, the microbumps 300, and the passivation layer 220 for encapsulating the chip 310a and the chip 310b. In one embodiment, the type of the chip 310a is same as the chip 310b. In another embodiment, the type of the chip 310a is different from the chip 310b.

Figure 15:
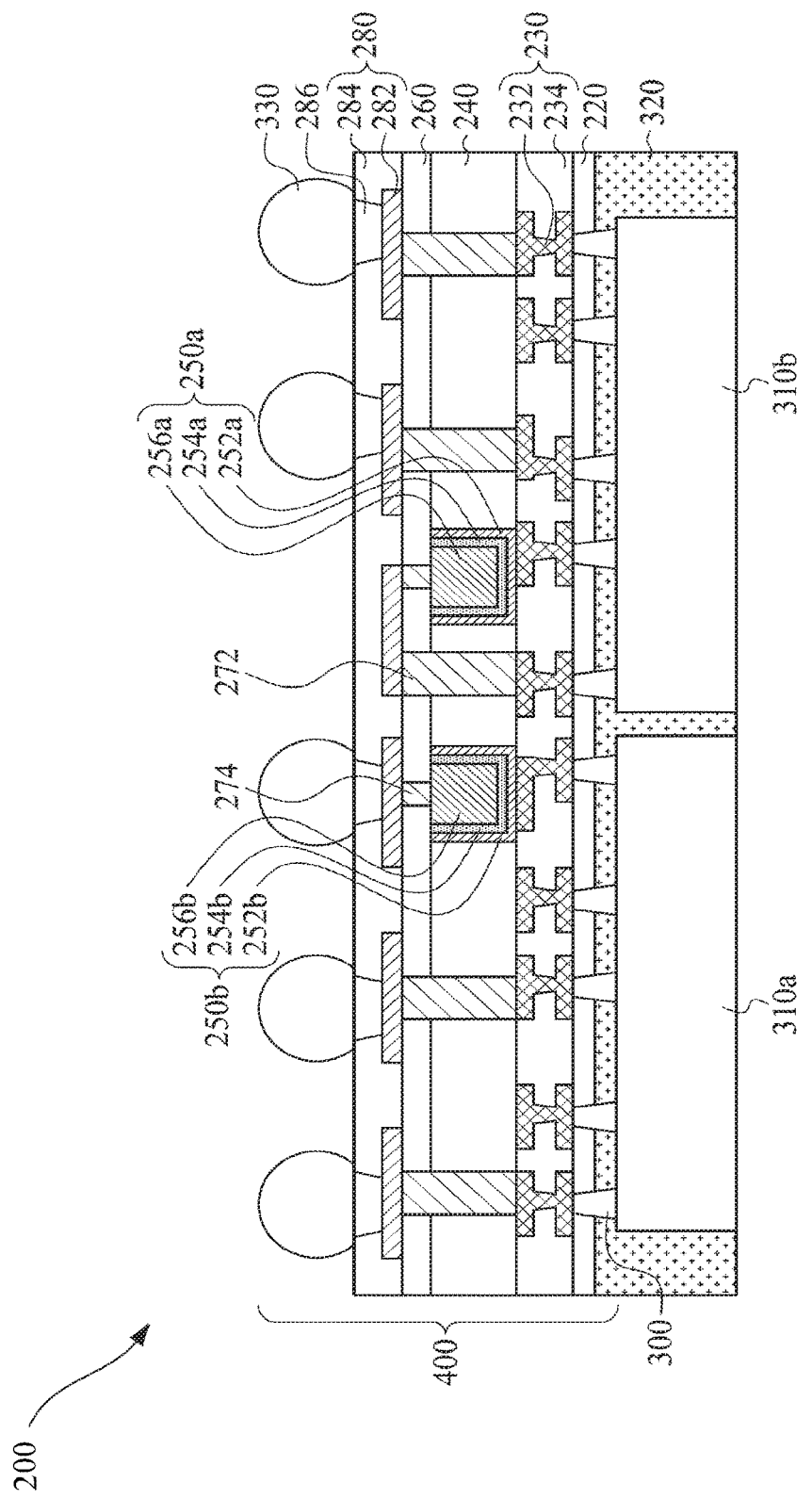

In operation 132, solder bumps 330 are formed to electrically connect with the second redistribution layer 280 to form the semiconductor package 200 as shown in FIG. 15. More specifically, before forming the solder bumps 330, the adhesion layer 292 and the second carrier layer 294 are removed to expose the UBM structures 286. Subsequently, the solder bumps 330 are formed on the UBM structures 286 and therefore electrically connect with the second redistribution layer 280. In one embodiment, the semiconductor package 200 further includes a package substrate (not shown), such as a printed circuit board (PCB). The solder bumps 330 can connect with the package substrate.

As shown in FIG. 15, the semiconductor package 200 includes an interposer 400, the chip 310a, the chip 310b, and the molding compound 320. The interposer 400 includes the passivation layer 220, the first redistribution layer 230, the organic substrate 240, the capacitor 250a, the capacitor 250b, the hard mask layer 260, the first conductive pillars 272, the second conductive pillars 274, the second redistribution layer 280, the microbumps 300, the UBM structures 286, and the solder bumps 330. The first redistribution layer 230 is on the passivation layer 220. The microbumps 300 are embedded in the passivation layer 220 and electrically connect with the first redistribution layer 230. The organic substrate 240 is on the first redistribution layer 230. The capacitor 250a and the capacitor 250b are embedded in the organic substrate 240. The capacitor 250a includes a first electrode layer 252a, a second electrode layer 256a, and a capacitor dielectric layer 254a between the first electrode layer 252a and the second electrode layer 256a. The capacitor 250b includes a first electrode layer 252b, a second electrode layer 256b, and a capacitor dielectric layer 254b between the first electrode layer 252b and the second electrode layer 256b. The first electrode layer 252a and first electrode layer 252b electrically connect with the first redistribution layer 230. The hard mask layer 260 is on the organic substrate 240. The first conductive pillars 272 are embedded in the organic substrate 240 and the hard mask layer 260 and electrically connect with the first redistribution layer 230. The second redistribution layer 280 is on the hard mask layer 260 and electrically connects with the second electrode layer 256a, the second electrode layer 256b, and the first conductive pillars 272. The UBM structures 286 are embedded in the second redistribution layer 280. The solder bumps 330 are disposed on the UBM structures 286 and the second redistribution layer 280 and electrically connect with the second redistribution layer 280.

Given above, the interposer and the semiconductor package of the present disclosure at least have the following advantages. The capacitors embedded in the organic substrate are trench-type and thus have high capacitance. Moreover, the capacitors only require small installation space, and therefore are beneficial for minimizing the size of the semiconductor package. Further, using the organic substrate can lower cost of fabricating the interposer and the semiconductor package. The hard mask layer having low coefficient of thermal expansion (CTE) can avoid interposer warpage and semiconductor package warpage.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following appended claims.

What is claimed is:

1. An interposer, comprising:
   a first redistribution layer comprising an interconnect structure;
   a single layer of organic material directly on the first redistribution layer;
   a capacitor embedded in the single layer of organic material, the capacitor extending between two opposing surfaces of the single layer of organic material and comprising a first electrode, a second electrode, and a capacitor dielectric between the first electrode and the second electrode, the first electrode directly electrically connecting with a surface of the interconnect structure of the first redistribution layer at one of the two opposing surfaces of the single layer of organic material;
   a single hard mask having a surface directly on another of the two opposing surfaces of the single layer of organic material;
   a first continuous conductive pillar embedded in and extending through the single layer of organic material and the single hard mask, the first continuous conductive pillar directly electrically connecting with the interconnect structure of the first redistribution layer at the one of the two opposing surfaces of the single layer of organic material; and
   a second redistribution layer comprising an interconnect structure having a surface directly on a surface of the single hard mask opposite the surface of the single hard mask on the another of the two opposing surfaces of the single layer of organic material, the interconnect structure of the second redistribution layer directly electrically connecting with the second electrode at the surface of the single hard mask opposite the surface thereof on the another of the two opposing surfaces of the single layer of organic material through a second continuous conductive pillar extending from the second electrode through the single hard mask between the surface thereof directly on the another of the two opposing surfaces of the single layer of organic material and the surface thereof opposite the surface thereof on the another of the two opposing surfaces of the single layer of organic material, and the interconnect structure of the second redistribution layer directly electrically connecting with the first continuous conductive pillar at the surface of the single hard mask on the another of the two opposing surfaces of the single layer of organic material.

2. The interposer of claim 1, wherein the first electrode surrounds the second electrode and is coaxial with the second electrode.

3. The interposer of claim 1, wherein the first electrode has a surface in contact with the surface of the interconnect structure of the first redistribution layer, the surface of the first electrode and the surface of the interconnect structure of the first redistribution layer meeting along a common plane.

4. The interposer of claim 1, wherein the second electrode has a surface in contact with the surface of the single hard mask, the surface of the second electrode and the surface of the single hard mask meeting along a common plane.

5. The interposer of claim 1, wherein the first continuous conductive pillar has a surface in contact with the surface of the interconnect structure of the second redistribution layer, the surface of the first continuous conductive pillar and the surface of the interconnect structure of the second redistribution layer meeting along a common plane.

6. The interposer of claim 1, further comprising a microbump extending through a passivation material on a surface of the first redistribution layer opposite the single layer of organic material and electrically connecting with the interconnect structure of the first redistribution layer.

7. A semiconductor package, comprising:
   the interposer of claim 1;
   a microbump electrically connecting with the interconnect structure of the first redistribution layer through a passivation material on a surface of the first redistribution layer opposite the single layer of organic material; and
   a chip connecting with the microbump.

8. The semiconductor package of claim 7, wherein the first electrode surrounds the second electrode and is coaxial with the second electrode.

9. The semiconductor package of claim 7, wherein the second electrode has a surface meeting the surface of the single hard mask along a common plane.

10. A method of fabricating a semiconductor package, comprising:
   forming a single layer of organic material on a first redistribution layer comprising an interconnect structure;
   embedding a capacitor in the single layer of organic material, the capacitor extending between two opposing surfaces of the single layer of organic material and comprising a first electrode, a second electrode, and a capacitor dielectric between the first electrode and the second electrode, the first electrode directly electrically connecting with a surface of the interconnect structure of the first redistribution layer at one of the two opposing surfaces of the single layer of organic material;
   forming a single hard mask having a surface directly on another of the two opposing surfaces of the single layer of organic material;
   embedding a first continuous conductive pillar in and extending through the single layer of organic material and the single hard mask to directly electrically connect the first continuous conductive pillar with the interconnect structure of the first redistribution layer at the one of the two opposing surfaces of the single layer of organic material;
   forming a second redistribution layer comprising an interconnect structure having a surface directly on a surface of the single hard mask opposite the surface of the single hard mask on the another of the two opposing surfaces of the single layer of organic material to electrically connect with the second electrode at the surface of the single hard mask opposite the surface thereof on the another of the two opposing surfaces of the single layer of organic material through a second continuous conductive pillar extending from the second electrode through the single hard mask between the surface thereof directly on the another of the two opposing surfaces of the single layer of organic material, and the interconnect structure of the second redistribution layer directly electrically connecting with the first continuous conductive pillar at the surface of the single hard mask on the another of the two opposing surfaces of the single layer of organic material;
   forming a microbump through a passivation layer on a surface of the first redistribution layer opposite the single layer of organic material to electrically connect with the interconnect structure of the first redistribution layer; and
   connecting a chip with the microbump.

11. The method of claim 10, wherein embedding the capacitor in the single layer of organic material comprises:
   forming a trench in the single layer of organic material to expose the first redistribution layer;
   forming the first electrode in the trench;
   forming the capacitor dielectric on the first electrode; and
   forming the second electrode on the capacitor dielectric.

12. The method of claim 10, wherein embedding the first continuous conductive pillar in the single hard mask and the single layer of organic material comprises:
   etching the single layer of organic material through a hole in the single hard mask to form a trench to expose the first redistribution layer; and
   forming the first continuous conductive pillar in the trench.

13. The method of claim 10, further comprising embedding the second continuous conductive pillar in the single hard mask between the second electrode and the interconnect structure of the second redistribution layer.

14. The method of claim 10, before forming the single layer of organic material on the first redistribution layer, further comprising forming the first redistribution layer on passivation material, and embedding the microbump in the passivation material in contact with the interconnect structure of the first redistribution layer.

* * * * *